(12) United States Patent
Takenaka

(10) Patent No.: US 8,665,416 B2
(45) Date of Patent: Mar. 4, 2014

(54) EXPOSURE APPARATUS AND METHOD OF MANUFACTURING DEVICE

(75) Inventor: Tsutomu Takenaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 545 days.

(21) Appl. No.: 12/358,599

(22) Filed: Jan. 23, 2009

(65) Prior Publication Data

US 2009/0195764 A1    Aug. 6, 2009

(30) Foreign Application Priority Data

Jan. 31, 2008    (JP) ................................. 2008-021648

(51) Int. Cl.
*G03B 27/42*    (2006.01)

(52) U.S. Cl.
USPC ................... 355/53; 355/52; 355/55; 355/67; 355/72; 355/75

(58) Field of Classification Search
USPC ............. 355/52, 53, 55, 67, 72, 75; 356/400, 356/401, 512–515, 620; 359/16; 250/492.2, 250/492.22, 548
See application file for complete search history.

(56) References Cited

U.S. PATENT DOCUMENTS

| | | | | |
|---|---|---|---|---|
| 4,888,614 A | * | 12/1989 | Suzuki et al. | 355/43 |
| 5,684,565 A | * | 11/1997 | Oshida et al. | 355/53 |
| 5,789,734 A | | 8/1998 | Torigoe et al. | |
| 6,614,535 B1 | | 9/2003 | Kakuchi et al. | |
| 6,633,362 B2 | | 10/2003 | Murakami et al. | |
| 6,992,780 B2 | * | 1/2006 | Sentoku et al. | 356/620 |
| 2005/0105093 A1 | * | 5/2005 | Tokita | 356/401 |
| 2005/0237510 A1 | * | 10/2005 | Shibazaki | 355/72 |
| 2006/0044536 A1 | * | 3/2006 | Ohsaki | 355/52 |
| 2006/0143172 A1 | * | 6/2006 | Ashida et al. | 707/6 |
| 2006/0250598 A1 | * | 11/2006 | Sasaki | 355/55 |
| 2006/0250607 A1 | * | 11/2006 | Takahashi | 356/124 |

FOREIGN PATENT DOCUMENTS

| | | |
|---|---|---|
| JP | 06-326000 A | 11/1994 |
| JP | 2000-277411 A | 10/2000 |
| JP | 2000-277412 A | 10/2000 |
| JP | 2001-332490 A | 11/2001 |
| JP | 2002-353099 A | 12/2002 |
| JP | 2004-128149 A | 4/2004 |

* cited by examiner

*Primary Examiner* — Toan Ton
*Assistant Examiner* — Mona M Sanei
(74) *Attorney, Agent, or Firm* — Canon USA, Inc. IP Division

(57) ABSTRACT

An exposure apparatus comprises a measurement system which measures an aberration of a projection optical system. The measurement system includes a first pattern positioned on an original stage, a second pattern positioned on a substrate stage, a third pattern positioned on the original stage to align the first and second patterns, a fourth pattern positioned on the substrate stage to align the first and second patterns, a detection system which detects a relative position between the third pattern and the fourth pattern, and a controller which controls at least one of the stages to align the first pattern positioned at a position spaced apart from the third pattern by a predetermined distance, and the second pattern positioned at a position spaced apart from the fourth pattern by a predetermined distance, based on the relative position between the third pattern and the fourth pattern detected by the detection system.

9 Claims, 9 Drawing Sheets

F I G. 10
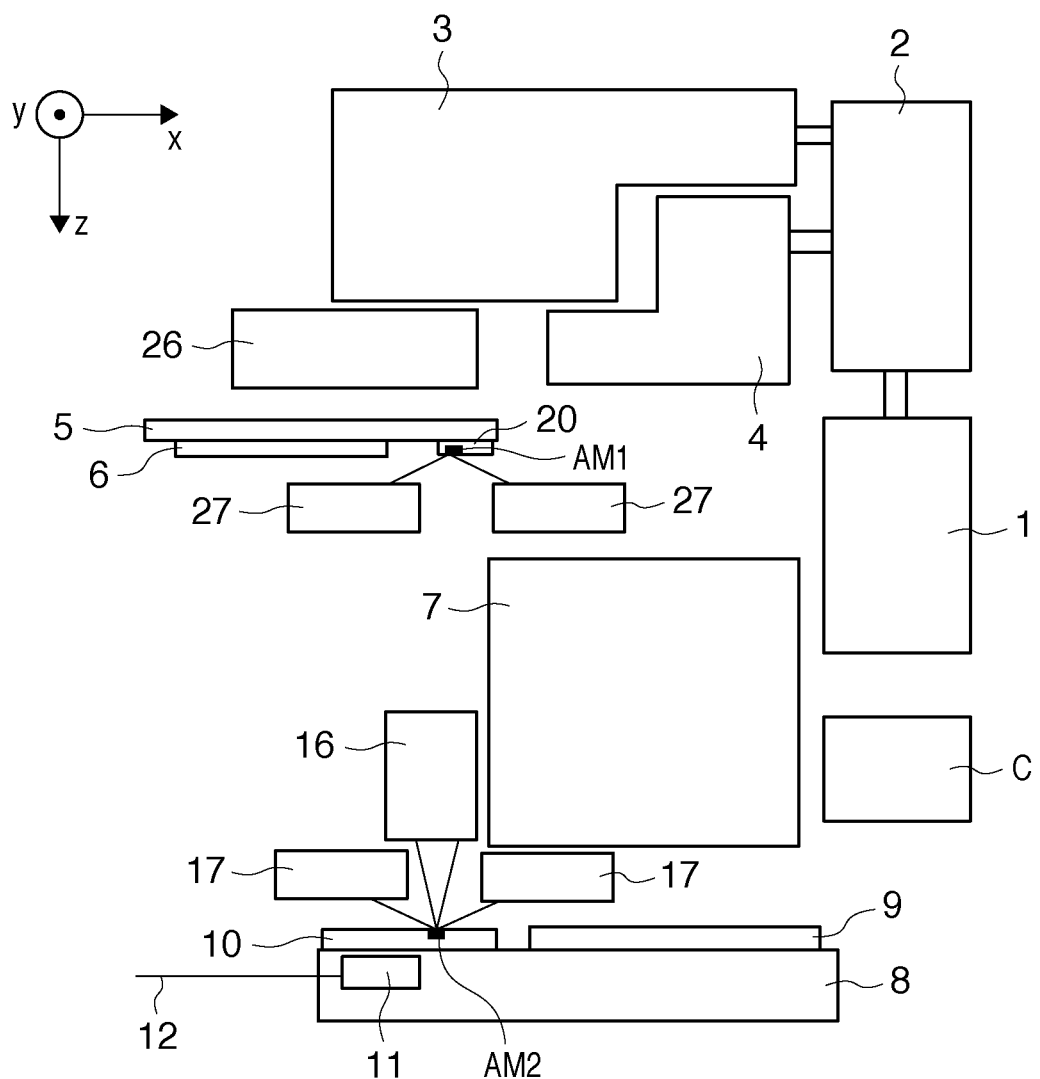

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

Conventionally, in manufacturing a device such as a semiconductor device or liquid crystal device using photolithography, the pattern of an original is transferred by exposure via a projection optical system onto a photosensitive substrate coated with a photosensitive agent.

In recent years, along with further acceleration of an increase in the packing density of devices, micropatterning on a photosensitive substrate is making remarkable advances. Examples of exposure apparatuses that play a central role in micropatterning are a mirror projection aligner, stepper, and scanner. The mirror projection aligner is a non-scaled projection exposure apparatus which exposes a photosensitive substrate while scanning it and an original with respect to a non-scaled mirror optical system having an arcuated exposure region. The stepper is a reduction projection exposure apparatus which forms a pattern image of an original on a photosensitive substrate by a refractive optical system, thereby exposing the photosensitive substrate by the step & repeat scheme. The scanner is a reduction projection exposure apparatus which exposes a photosensitive substrate while scanning it in synchronism with scanning of an original.

These days, along with an increase in the resolution of a projection optical system mounted in a projection exposure apparatus, a strict demand has arisen for correction of the aberration of the projection optical system. It is therefore indispensable to measure and check the aberration of a projection optical system after mounting it into the main body of an exposure apparatus.

To meet these demands, Japanese Patent Laid-Open Nos. 2000-277411 and 2000-277412 each disclose an exposure apparatus which mounts an interferometer capable of measuring the aberration of a projection optical system in its main body.

The interferometer forms interference fringes using an aberration measurement pattern such as a pinhole having a diameter equal to or less than the diffraction limit of light or a slit having a width equal to or less than the diffraction limit of light, and measures the interference fringes using, for example, an image sensing element. Measurement methods that use a Fizeau interferometer and shearing interferometer are also available.

To measure the aberration of the projection optical system by an interferometer formed using fine aberration measurement patterns (for example, pinholes or slits), original-side and photosensitive-substrate-side aberration measurement patterns must be aligned with appropriate positions with high accuracy. The original-side aberration measurement pattern is formed on the original or in its vicinity, and the photosensitive-substrate-side aberration measurement pattern is formed on the photosensitive substrate or its vicinity.

There is a method of measuring, by an image sensing element or the like, the amount of light guided from the illumination optical system to it via the original-side aberration measurement pattern, projection optical system, and photosensitive-substrate-side aberration measurement pattern, and aligning the relative position between the original-side and photosensitive-substrate-side aberration measurement patterns. In this method, the correlation between an appropriate position and the light amount at this position is checked in advance, and a position at which a desirable light amount is measured by scanning one or both of the original-side and photosensitive-substrate-side aberration measurement patterns is determined as an appropriate position.

However, because each aberration measurement pattern is a micropattern having a size equal to or less than the diffraction limit of light, it is difficult to obtain the relative position between the original-side and photosensitive-substrate-side aberration measurement patterns. To measure an appropriate light amount by the light amount detector, it is necessary to frequently repeat scanning of one or both of the original-side and photosensitive-substrate-side aberration measurement patterns. Consequently, it takes a lot of time to align the aberration measurement patterns, which makes it impossible to timely measure the aberration of the projection optical system.

SUMMARY OF THE INVENTION

It is an object of the present invention to provide an exposure apparatus capable of aligning, in a short period of time, aberration measurement patterns used to measure the aberration of a projection optical system.

According to the first aspect of the present invention, there is provided an exposure apparatus which exposes a substrate to a pattern of an original, the apparatus comprises an original stage which supports the original, a substrate stage which supports the substrate, a projection optical system which projects the pattern of the original onto the substrate, and a measurement system which measures an aberration of the projection optical system, the measurement system including a first pattern for aberration measurement, which is positioned on the original stage, a second pattern for aberration measurement, which is positioned on the substrate stage, a third pattern positioned on the original stage to align the first pattern and the second pattern, a fourth pattern positioned on the substrate stage to align the first pattern and the second pattern, a detection system which detects a relative position between the third pattern and the fourth pattern, and a controller which controls at least one of the original stage and the substrate stage to align the first pattern positioned at a position spaced apart from the third pattern by a predetermined distance, and the second pattern positioned at a position spaced apart from the fourth pattern by a predetermined distance, based on the relative position between the third pattern and the fourth pattern detected by the detection system.

According to the second aspect of the present invention, there is provided an exposure apparatus which exposes a substrate to a pattern of an original, the apparatus comprises an original stage which supports the original, a substrate stage which supports the substrate, a projection optical system which projects the pattern of the original onto the substrate, and a measurement system which measures an aberration of the projection optical system, the measurement system including a first pattern for aberration measurement, which is positioned on the original stage, a second pattern for aberration measurement, which is positioned on the substrate stage, a detection system which senses the first pattern and the second pattern and determines a relative position between the first pattern and the second pattern from the sensing result, and a controller which controls at least one of the original stage and the substrate stage to align the first pattern and the second pattern, based on the relative position between the first pattern and the second pattern determined by the detection system.

According to the present invention, it is possible to provide an exposure apparatus capable of aligning, in a short period of time, aberration measurement patterns used to measure the aberration of a projection optical system.

Further features of the present invention will become apparent from the following description of exemplary embodiments with reference to the attached drawings.

BRIEF DESCRIPTION OF THE DRAWINGS

FIG. 10 is a view showing still another example of the exposure apparatus according to the present invention;

DESCRIPTION OF THE EMBODIMENTS

First Embodiment

Figure 1:
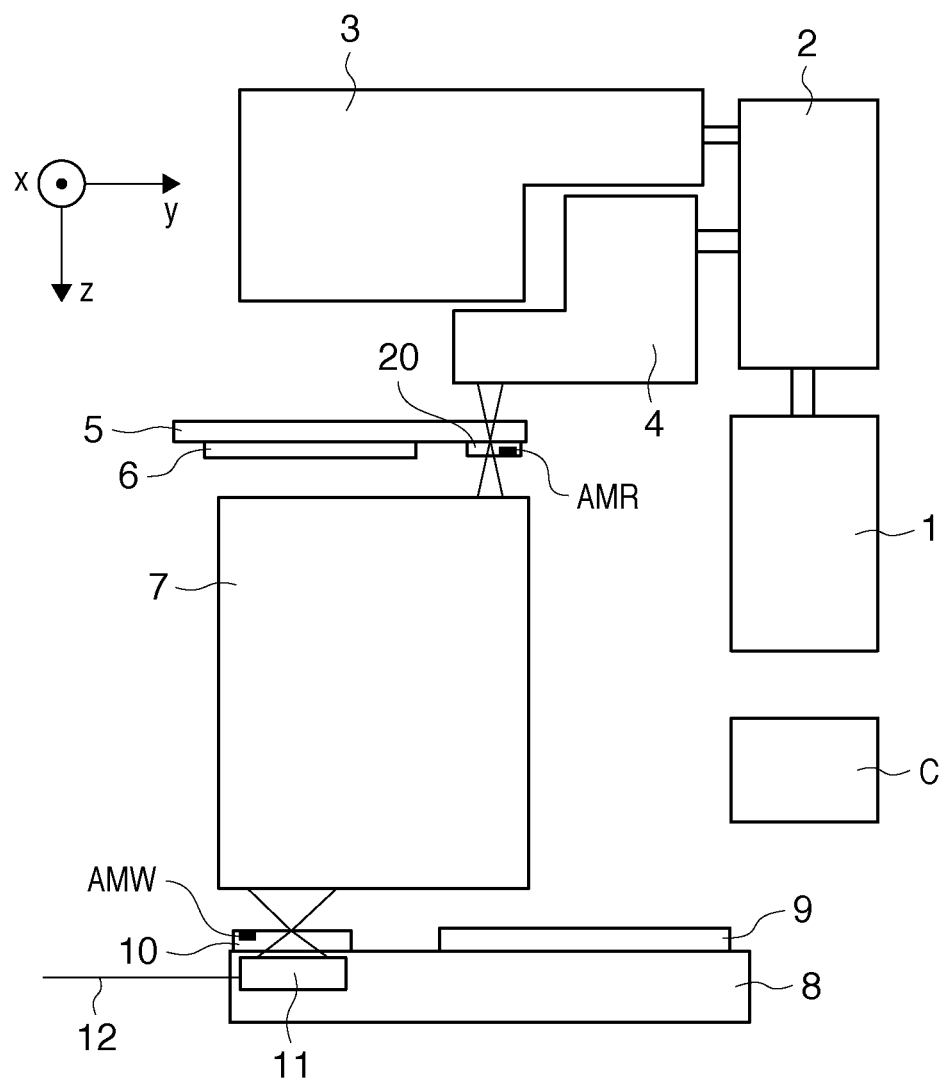
FIG. 1 is a view showing an example of an exposure apparatus according to the present invention.

FIG. 1 is a view showing an example of an exposure apparatus which mounts a measurement system for measuring the aberration of a projection optical system for projecting the pattern of an original onto a substrate. Referring to FIG. 1, a light beam emitted by an exposure light source 1 such as an excimer laser is relayed to a first illumination system 3 in the main body of the exposure apparatus by a relay optical system 2. All or some components of the light beam are also relayed to a TTR alignment scope 4 via a second illumination system (not shown). The TTR alignment scope 4 accurately aligns, via a projection optical system 7, an alignment mark AMR positioned on a reticle (original) 6 or in its vicinity and an alignment mark AMW positioned on a wafer (photosensitive substrate) 9 or in its vicinity. In normal exposure, the TTR alignment scope 4 is retracted outside the optical path of the projection optical system 7. In alignment, a part or the whole of the TTR alignment scope 4 is driven and inserted into the optical path of the projection optical system 7.

The light beam which has entered the first illumination system 3 undergoes, for example, light beam shaping, conversion into incoherent light, σ adjustment, and field adjustment, and illuminates the reticle 6. The reticle 6 is supported on a reticle stage (original stage) 5, which is driven in accordance with the progress of exposure in a scanning exposure apparatus. A controller C controls the reticle stage 5 and a wafer stage (substrate stage) 8.

A transfer pattern formed on the reticle 6 is projected and transferred by exposure via the projection optical system 7 onto the wafer 9 supported by the wafer stage 8. A first mask 20 on which a first pattern for measuring the aberration of the projection optical system 7 is formed is mounted near the reticle 6 supported by the reticle stage 5. In this embodiment, an alignment mark AMR for aligning the reticle 6 is also formed on the first mask 20. A second mask 10, image sensing element 11, and communication cable 12 are mounted on the wafer stage 8 in order to measure the aberration of the projection optical system 7.

A second pattern for measuring the aberration of the projection optical system 7 is formed on the second mask 10. In this embodiment, an alignment mark AMW for aligning the wafer 9 is also formed on the second mask 10. By appropriately aligning the relative position between the two aberration measurement patterns formed on the first mask 20 and second mask 10, interference fringes are formed on the image sensing element 11 and measured. The measured interference fringes undergo signal processing by a processing device (not shown) which calculates the aberration via the communication cable 12, thereby measuring the aberration of the projection optical system 7.

Figure 2:
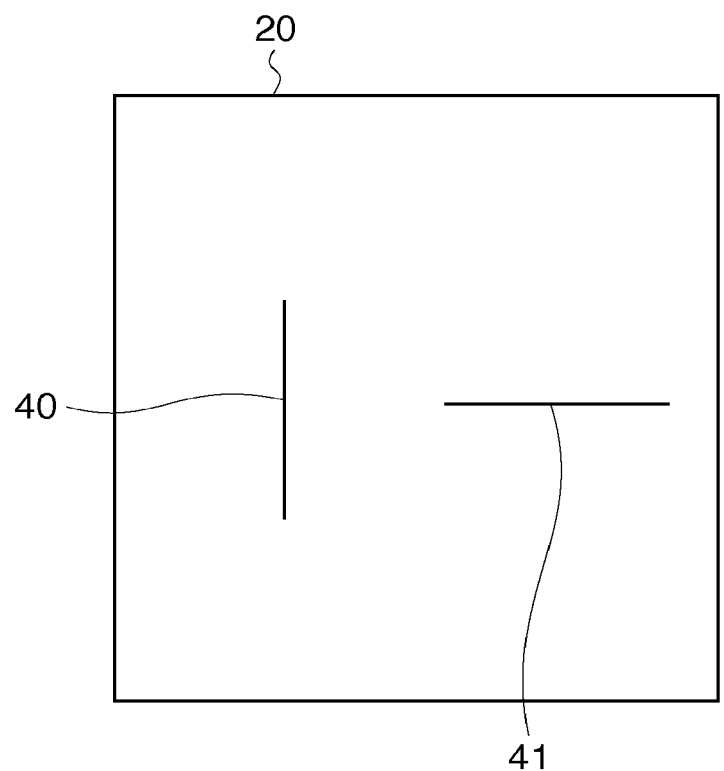
FIG. 2 is a schematic view showing the main part of a first mask.

A method of measuring the aberration of the projection optical system 7 will be explained simply. FIG. 2 is a schematic view showing the first mask 20 positioned on the reticle side. The first mask 20 includes two types of slits 40 and 41 which have an angular interval of 90°. The slits 40 and 41 are the same in the width and length and different in only the direction. The slits 40 and 41 constitute the first pattern for aberration measurement on the reticle side. The slit 40 will be referred to as a 0°-slit, and the slit 41 will be referred to as a 90°-slit hereinafter. The slits 40 and 41 each have a width Δr which is equal to or less than the diffraction limit and is determined by:

$$\Delta r < 0.5 \lambda / NAo \quad (1)$$

where NAo is the reticle-side, that is, object-side numerical aperture of the projection optical system 7, and λ is the exposure wavelength.

Adjusting the slit width Δr to satisfy relation (1) allows the light beams diffracted by the slits 40 and 41 to be in phase with each other within the range of NAo. Although a length Lr is preferably as long as possible in order to ensure a sufficient light amount, it must fall within the so-called isoplanatic region in which the aberration of the projection optical system 7 is uniform.

The light beam from the first illumination system 3 irradiates only the 0°-slit 40 first. Because the slit 40 has a width equal to or less than the diffraction limit, the light passing through it is diffracted light which diverges in the x direction of FIG. 2 and has wavefronts in phase with each other in the x direction.

Because the amount of diffraction of the light in the y direction, that is, the longitudinal direction of the slit 40 is small, the first illumination system 3 irradiates the slit 40 in the y direction of FIG. 2 with a light beam having a numerical aperture equal to or higher than the object-side, that is, reticle-side numerical aperture of the projection optical system 7. With this operation, the entire plane of the optical pupil of the projection optical system 7 is irradiated with the light. In addition, the light diffracted in the lateral direction of the slit 40 has wavefronts in phase with each other.

Figure 3:
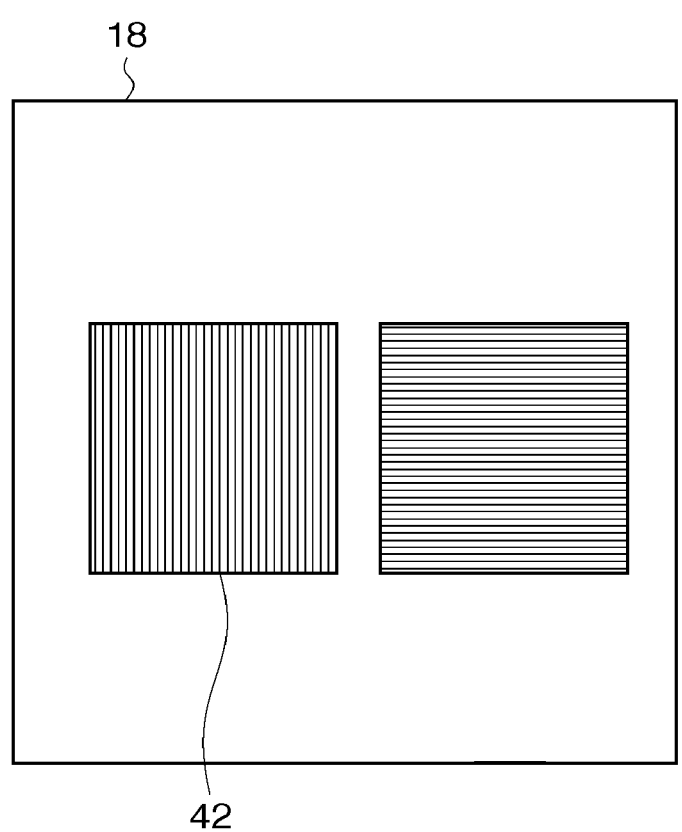
FIG. 3 is a schematic view showing the main part of a light beam splitting unit.

FIG. 3 shows a light beam splitting unit 18 according to this embodiment. Referring to FIG. 3, the light beam splitting unit 18 is an amplitude type diffraction grating. In measurement using the slit 40 having its long side in the y direction, a diffraction grating in which lines align themselves in the x direction and which is represented by reference numeral 42 in FIG. 3 is used. The diffraction grating 42 splits the light beam in the x direction of FIG. 3. The plurality of split light beams form an image on the second mask 10 by the projection optical system 7.

Figure 4:
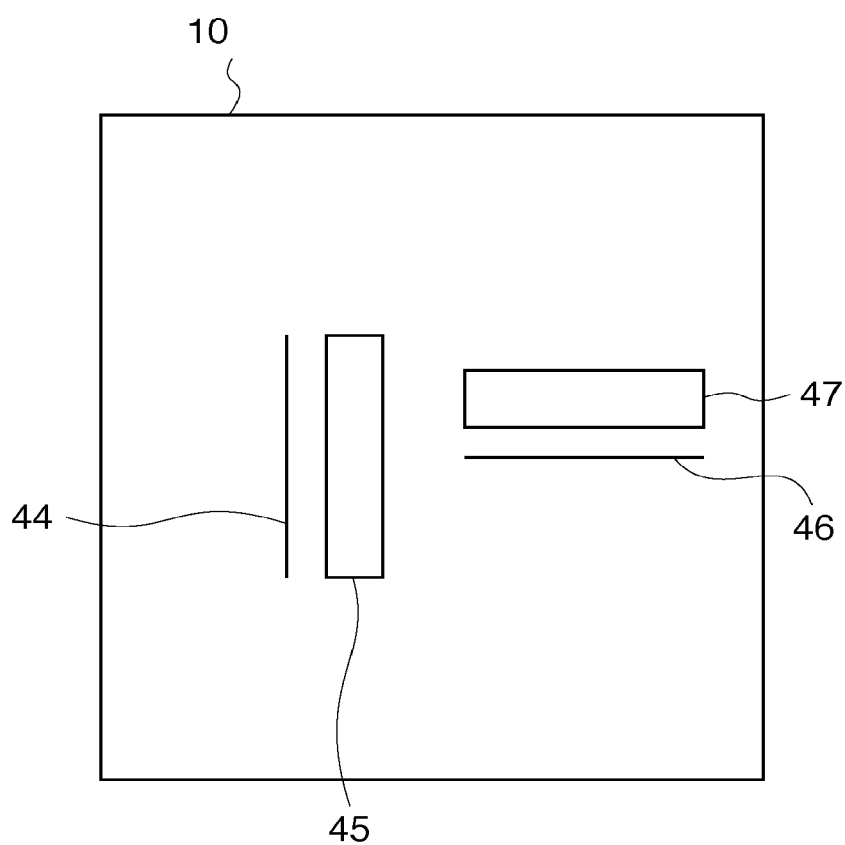
FIG. 4 is a schematic view showing the main part of a second mask.

FIG. 4 shows details of the second mask 10. The second mask 10 includes a pair of a slit 44 and window 45 running along the 0° direction, and a pair of a slit 46 and window 47 running along the 90° direction. The slits 44 and 46 and windows 45 and 47 constitute the second pattern for aberration measurement on the wafer side. The pair of the slit 44 and window 45 and that of the slit 46 and window 47 are the same in width, interval, and the like but are different in direction.

The slits 44 and 46 each have a width Δw which is equal to or less than the diffraction limit and is determined by:

$$\Delta w < 0.5 \lambda \times /NAi \quad (2)$$

where NAi is the wafer-side, that is, image-side numerical aperture of the projection optical system 7.

Adjusting the width Δw of each of the slits 44 and 46 to satisfy relation (2) allows the light beams diffracted by the slits 44 and 46 to be in phase with each other within the range of NAi.

A window width Δw' is determined in accordance with the spatial frequency of the projection optical system 7, which is to be measured. The window width Δw' is set wide if high-frequency components are to be measured, while it is set narrow if low-frequency components are to be measured. The window width Δw' is given by:

$$\Delta w' = 2 \times f \times \lambda /NAi$$

where f is the spatial frequency of the pupil of the projection optical system 7. Note that the frequency f of a wavefront aberration having a period matching the pupil radius is assumed to be 1.

Although a length Lw of each of the slit 44 and window 45 is preferably as long as possible in order to ensure a sufficient light amount, it must fall within the so-called isoplanatic region in which the aberration of the projection optical system 7 is uniform.

The pitch of the diffraction grating 42 is determined such that, of the light components diffracted by the slit 40 and diffraction grating 42, the 0th-order light component forms an image on the slit 44 and the 1st-order light component forms an image on the window 45. Other diffracted light components are shielded by a light-shielding area on the second mask 10. The −1st-order light component may be used in place of the 1st-order light component.

Figure 5:
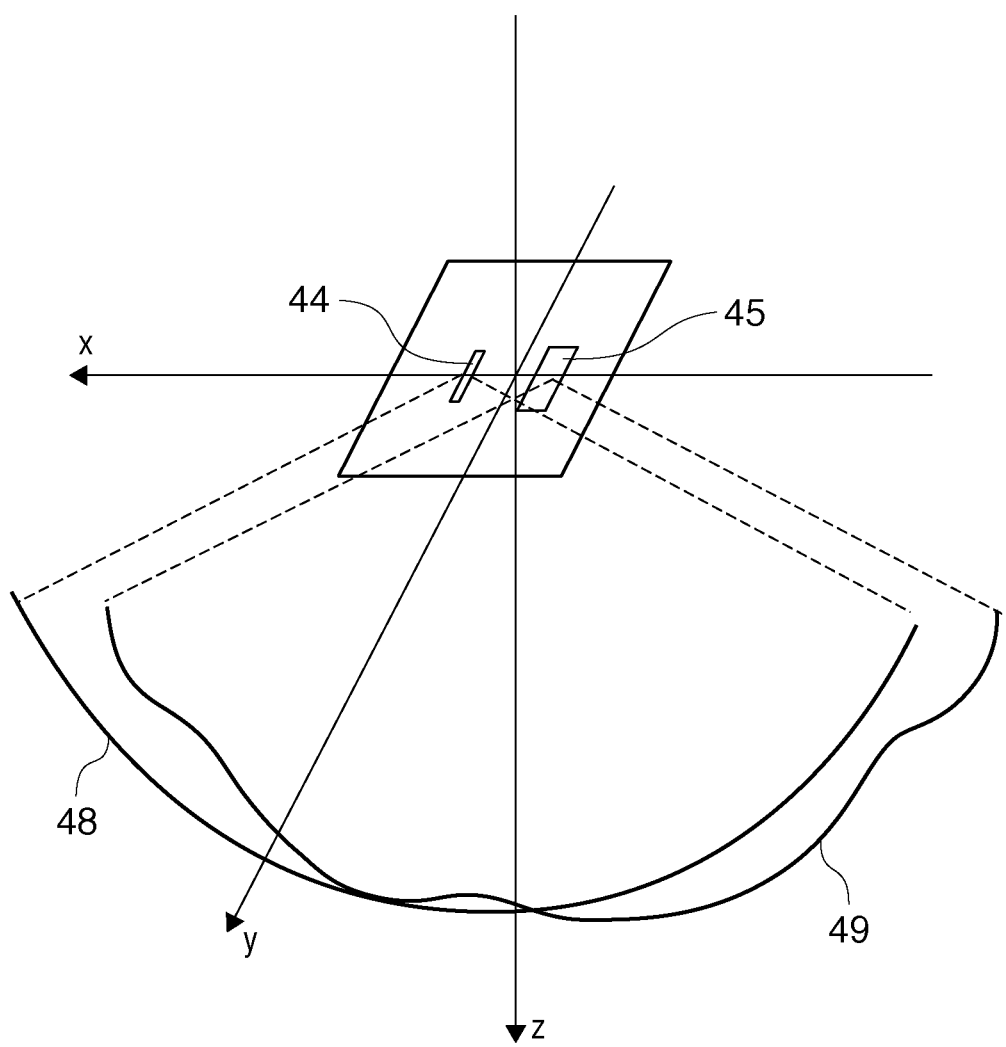
FIG. 5 is a schematic view showing the wavefronts of light beams passing through a slit and window.

The light beam having passed through the window 45 has come under the influence of the wavefront aberration of the projection optical system 7. In contrast, because the slit 44 has a width equal to or less than the diffraction limit, the light passing through it is diffracted light which diverges in the x direction of FIG. 4 and therefore bears no information of the wavefront aberration of the projection optical system 7 in the x direction, that is, has wavefronts in phase with each other in the x direction. FIG. 5 is a schematic view showing the light beams passing through the centers of the slit 44 and window 45.

Figure 6:
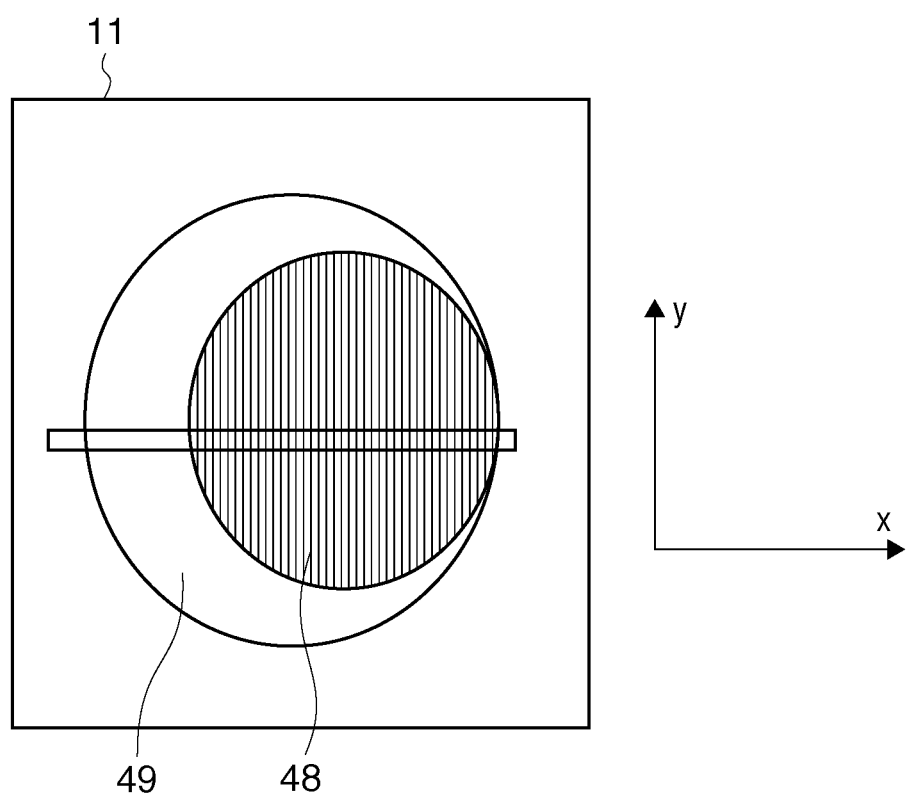
FIG. 6 is a schematic view showing interference fringes observed by an image sensing element.

Interference fringes of the two light beams from the slit 44 and window 45 are observed by the image sensing element 11 such as a CCD. FIG. 6 shows the interference fringes. Two images of the pupil of the projection optical system 7, the centers of which are shifted from each other by the interval between the slit 44 and the window 45, are sensed. Interference fringes have occurred in a region common to these images. Referring to FIG. 6, an image 48 represents the light beam from the slit 44, and an image 49 represents the light beam from the window 45.

The wavefronts of the light beam 49 in the x direction are in phase with each other. Hence, extracting phase information from the interference fringes shown in FIG. 6 makes it possible to obtain the wavefront aberration of the projection optical system 7 in the x direction.

However, to form interference fringes on the image sensing element 11, aberration measurement patterns having the same direction on the first mask 20 and second mask 10 must be aligned with a relatively appropriate position. For example, the position of the slit 40 on the first mask 20 must be relatively aligned with that of the slit 44 or window 45 on the second mask 10, or the position of the slit 41 on the first mask 20 must be relatively aligned with the slit 46 or window 47 on the second mask 10. The relatively appropriate position means herein a position optimum for measuring the aberration of the projection optical system 7.

An alignment method according to this embodiment will be explained below.

Figure 7:
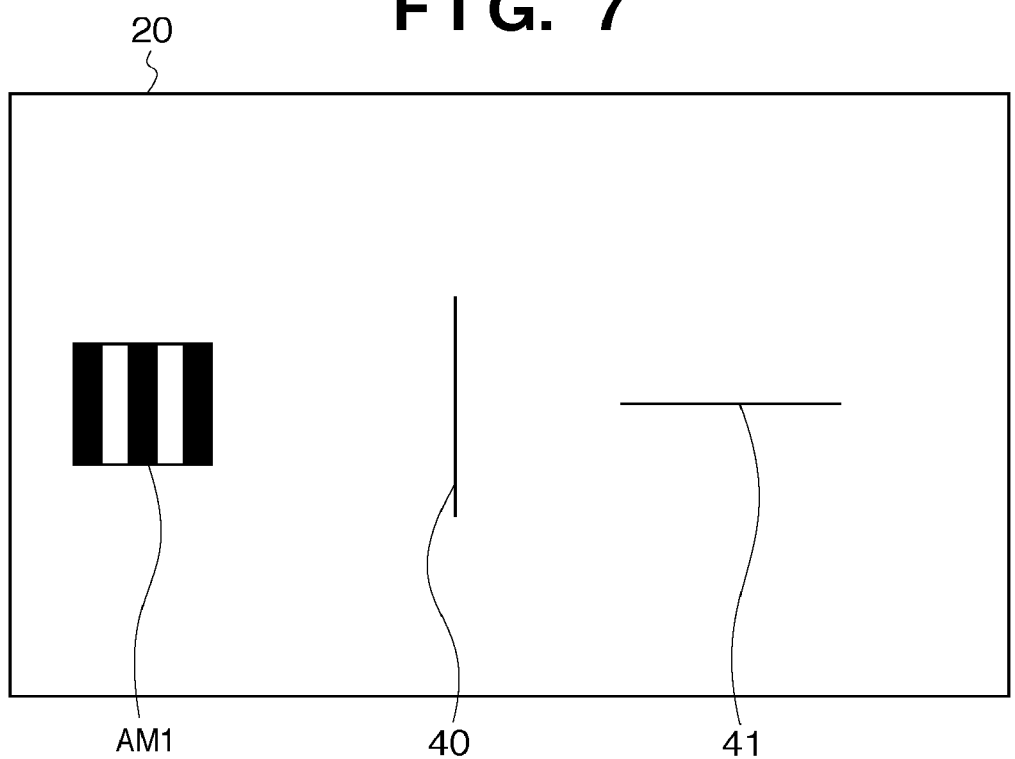
FIG. 7 is a schematic view showing the arrangement of a pattern on the first mask.
Figure 8:
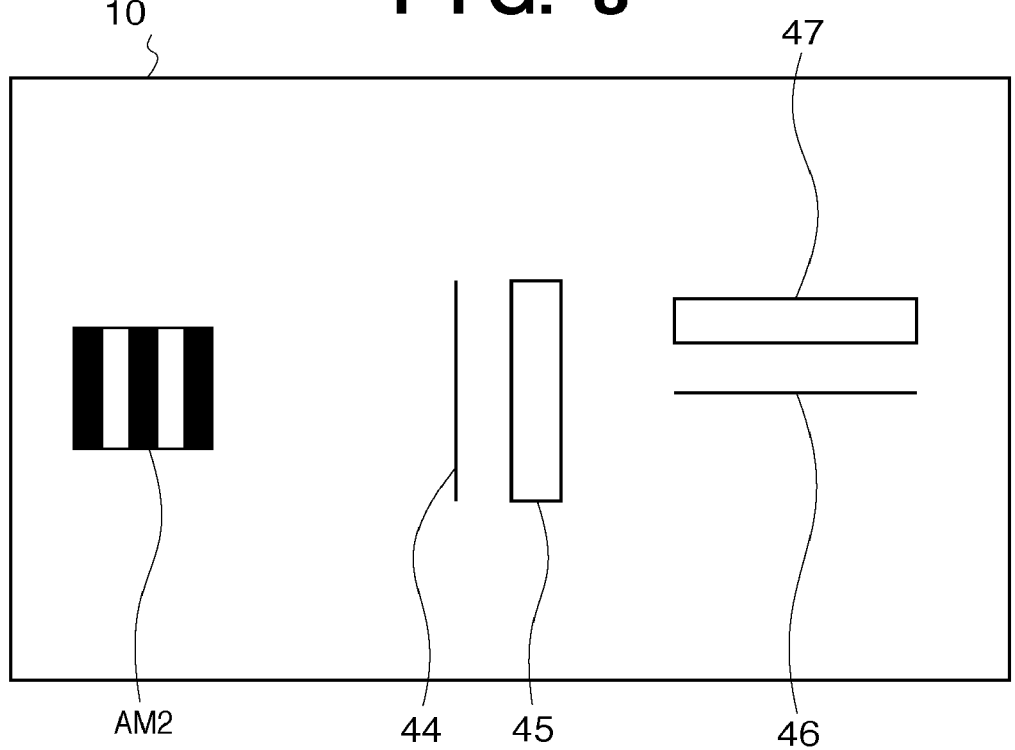
FIG. 8 is a schematic view showing the arrangement of a pattern on the second mask.

In this embodiment, alignment mark 1 is formed on the first mask 20, and alignment mark 2 is formed on the second mask 10 (see FIGS. 7 and 8) in order to align marks having the same direction on the first mask 20 and second mask 10 with a relatively appropriate position. In the following description, alignment mark 1 will be referred to as a mark AM1, and alignment mark 2 will be referred to as a mark AM2. A mark AM1 is formed at a position spaced apart from an aberration measurement pattern (for example, the slit 40) on the first mask 20 by a predetermined distance. Also, a mark AM2 is formed at a position spaced apart from an aberration measurement pattern (for example, the slit 44) on the second mask 10 by a predetermined distance. The marks AM1 and AM2 constitute a third pattern and fourth pattern, respectively, for aligning the reticle-side aberration measurement pattern and the wafer-side aberration measurement pattern. The controller C relatively aligns the first pattern and second pattern for aberration measurement, using the marks AM1 and AM2. In this embodiment, a TTR alignment scope 4 which simultaneously senses both the alignment marks AM1 and AM2 and determines the relative position between the marks AM1 and AM2 from the sensing result is used as a detection system which aligns the marks AM1 and AM2. Using the TTR alignment scope 4, the mark AM1 is illuminated and observed using the light reflected by a light reflective area on the mark AM1. The illumination light transmitted through a light transmissive area on the mark AM1 illuminates the mark AM2 via the projection optical system 7, and the light reflected by the mark AM2 is observed via the projection optical system 7 as well. Because the marks AM1 and AM2 can be observed simultaneously, their relative position can be measured with high accuracy free from the influence of, for example, a temporal change in the TTR alignment scope 4. The use of the measured information makes it possible to align the relative position between the marks AM1 and AM2 with an appropriate position with high accuracy. After the marks AM1 and AM2 are aligned, the first mask 20 is moved by the distance between the mark AM1 and the first pattern 40 for aberration measurement on the first mask 20, and the second mask 10 is moved by the distance between the mark AM2 and the second pattern 44 for aberration measurement on the second mask 10. This makes it possible to align the aberration measurement pattern 40 on the first mask 20 and the aberration measurement pattern 44 on the second mask 10.

The positional relationship between the aberration measurement pattern 40 and third pattern AM1 on the first mask 20, and that between the aberration measurement pattern 44 and fourth pattern AM2 on the second mask 10 are preferably determined by taking account of the reduction ratio of the projection optical system. In this state, alignment of the relative position between the third pattern AM1 and the fourth pattern AM2 amounts to alignment of the relative position between the aberration measurement patterns on the first mask and second mask. That is, in this state, the relative position between the aberration measurement patterns on the first mask and second mask can be aligned with high accuracy in a short period of time without moving the first mask and second mask.

In aligning the aberration measurement patterns, the alignment marks can be positioned to fall outside an illumination region minimum required to measure the aberration of the projection optical system. Also in observing the alignment marks by the TTR alignment scope, they can be positioned to fall outside the illumination region. This obviates the need to retract the TTR alignment scope to the outside of the optical path in measuring the aberration of the projection optical system, which makes it possible to save the retraction time. It is therefore possible to start aberration measurement in a short period of time after the relative position between the aberration measurement patterns on the first mask and second mask is aligned.

Although the aberration measurement patterns and the marks AM1 and AM2 are separate marks in this embodiment, the present invention is not particularly limited to this.

Second Embodiment

The second embodiment will be described below. Note that the same reference numerals as in the above-described first embodiment denote the same or similar constituent components in the second embodiment, and a description thereof will be given simply or will not be given.

Figure 9:
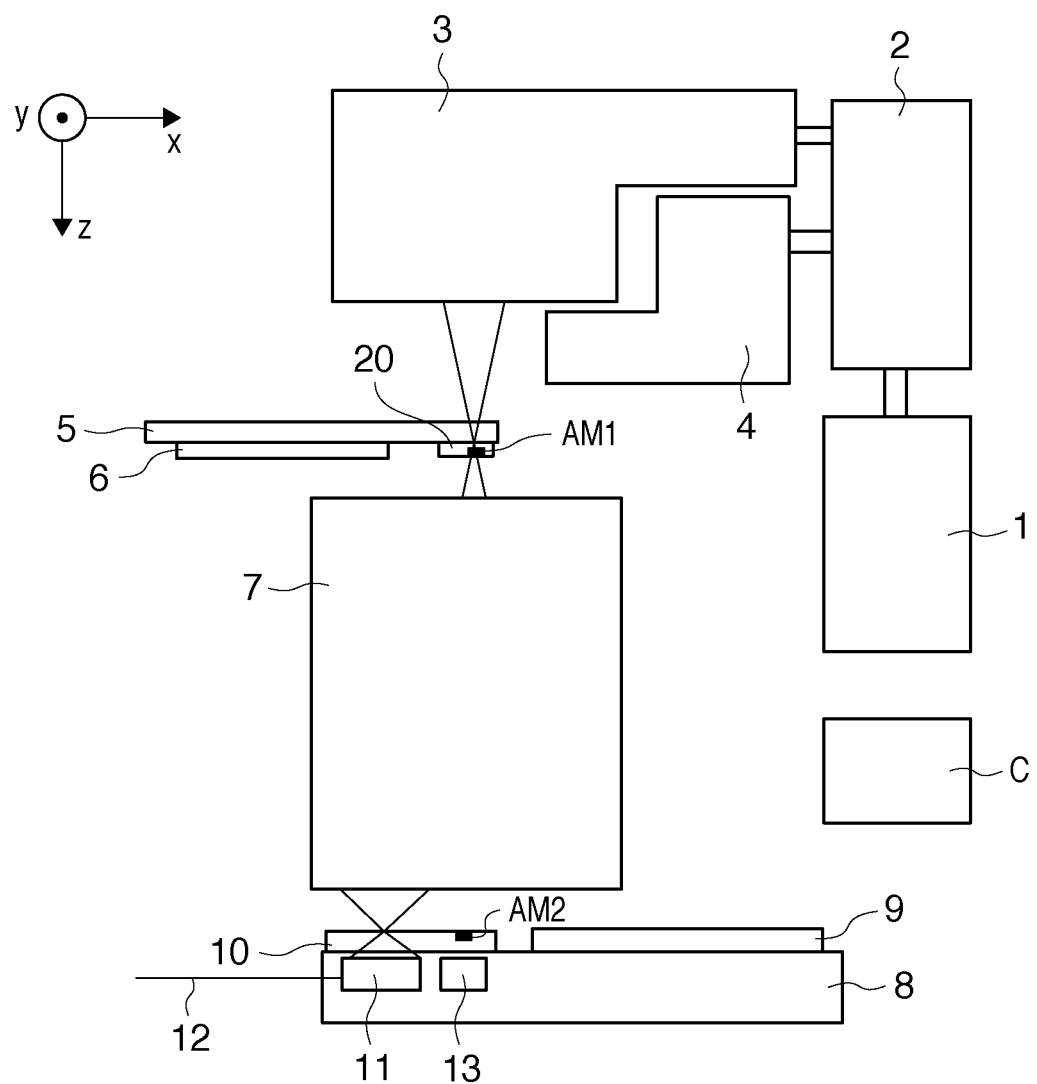
FIG. 9 is a view showing another example of the exposure apparatus according to the present invention.

FIG. 9 is a view showing the schematic arrangement of an exposure apparatus according to this embodiment. In this embodiment, not the TTR alignment scope 4 but a light amount detector 13 which detects the amount of light transmitted through both a mark AM1 serving as the third pattern and a mark AM2 serving as the fourth pattern is used to align them. The light amount detector 13 is, for example, a photodiode and is set below a second mask 10 on a wafer stage. Alternatively, a relay optical system may be set below the second mask 10, and a light amount detector may be positioned at an arbitrary position inside or outside the wafer stage.

A method of aligning a reticle-side aberration measurement pattern and a wafer-side aberration measurement pattern in this embodiment will be explained. Light emitted by an exposure light source 1 irradiates a mark AM1 on a first mask 20 upon propagating through a first illumination system 3. The light transmitted through a light transmissive area on the mark AM1 irradiates a mark AM2 on the second mask 10 upon propagating through a projection optical system 7. The light transmitted through a light transmissive area on the mark AM2 enters the light amount detector 13. The amount of incident light is determined in accordance with the relative positional relationship between the marks AM1 and AM2. In general, the light amount detector 13 is designed such that the marks AM1 and AM2 have an optimal relative positional relationship with which the amount of light transmitted through the marks AM1 and AM2, that is, the output from the light amount detector 13 becomes a maximum. However, the present invention is not particularly limited to this, and the light amount detector 13 may be designed such that the marks AM1 and AM2 have an optimal relative positional relationship with which the light amount becomes a minimum, or their relative position may be calculated from other characteristics.

In this embodiment, because the marks AM1 and AM2 can be observed simultaneously, their relative position can be measured with high accuracy free from the influence of, for example, a temporal change in the TTR alignment scope 4. Also, because the number of constituent components necessary for the measurement is suppressed to be small, systematic errors can be reduced. After the relative position between the marks AM1 and AM2 is aligned, the first mask is moved by the distance between the mark AM1 and the aberration measurement pattern on the first mask, and the second mask is moved by the distance between the mark AM2 and the aberration measurement pattern on the second mask. This makes it possible to align the aberration measurement patterns on the first mask and second mask.

Although this embodiment has been described assuming that the light amount detector 13 and an image sensing element 11 serving as an aberration measurement system of the projection optical system are separate constituent components, the present invention is not particularly limited to this, and they may be the same constituent component.

Although the marks AM1 and AM2 are illuminated using the first illumination system 3 and aligned in this embodiment, the present invention is not particularly limited to this. The marks AM1 and AM2 may be illuminated using a separately prepared illumination system and aligned.

Third Embodiment

The third embodiment will be described below. Note that the same reference numerals as in the above-described first and second embodiments denote the same or similar constituent components in the third embodiment, and a description thereof will be given simply or will not be given.

FIG. 10 is a view showing the schematic arrangement of an exposure apparatus according to this embodiment. The apparatus includes a reticle alignment scope (original alignment scope) 26 for aligning a reticle and first mask in the X and Y directions, and a reticle focus sensor 27 for aligning them in the Z direction. The reticle alignment scope 26 includes, for example, an image sensing element such as a CCD and a plurality of optical elements. The image sensing element can be conjugate to the reticle surface and first mask surface, and the reticle surface and first mask surface can be observed in this state. The reticle focus sensor 27 includes, for example, an oblique-incidence optical system and an image sensing element such as a CCD, and detects the positions of the reticle surface and first mask surface in the Z direction as a misalignment on the image sensing element.

The apparatus includes a wafer alignment scope (substrate alignment scope) 16 for aligning the wafer and second mask in the X and Y directions, and a wafer focus sensor 17 for aligning them in the Z direction. The wafer alignment scope 16 includes, for example, an image sensing element such as a CCD and a plurality of optical elements. The image sensing element can be conjugate to the wafer surface and second mask surface, and the wafer surface and second mask surface can be observed in this state. The wafer focus sensor 17 includes, for example, an oblique-incidence optical system and an image sensing element such as a CCD, and detects the positions of the wafer surface and second mask surface in the Z direction as a misalignment on the image sensing element.

In aligning the relative position, in the X and Y directions, of the aberration measurement pattern formed on the first mask, the reticle alignment scope 26 measures a mark AM1. Also, in aligning the relative position, in the Z direction, of the aberration measurement pattern formed on the first mask, the reticle focus sensor 27 measures the mark AM1. It is possible to know the relative position between the mark AM1 and the aberration measurement pattern from a design value or a value obtained in advance. Likewise, in aligning the relative position, in the X and Y directions, of the aberration measurement pattern formed on the second mask, the wafer alignment scope 16 measures a mark AM2. Also, in aligning the relative position, in the Z direction, of the aberration measurement pattern formed on the second mask, the wafer focus sensor 17 measures the mark AM2. It is possible to know the relative position between the mark AM2 and the aberration measurement pattern from a design value or a value obtained in advance.

It is possible to align the relative position between the aberration measurement patterns on the first mask and second mask based on the positions of the marks AM1 and AM2 measured in the above-described way.

Although the reticle focus sensor 27 measures the mark AM1, and the wafer focus sensor 17 measures the mark AM2, the present invention is not particularly limited to this. Because both the focus sensors adopt a misalignment detection scheme which uses an oblique-incidence optical system, they may perform measurement using the planes on the first mask and second mask.

Although the reticle focus sensor 27 and wafer focus sensor 17 measure the marks AM1 and AM2, respectively, in this embodiment, the present invention is not particularly limited to this. Because both the focus sensors 27 and 17 are of the oblique-incidence scheme, they can measure arbitrary points on the mask planes. It is therefore possible to perform the alignment using the measurement values at arbitrary points on the mask planes in place of the positions of the marks AM1 and AM2.

Because the deformation of the mask surface can be measured by measuring a plurality of points on the mask plane, alignment can be performed with a higher accuracy by correcting the measurement values by the amount of deformation.

Fourth Embodiment

The fourth embodiment of the present invention will be described below with reference to FIG. 1. Note that the same reference numerals as in the above-described first embodiment denote the same or similar constituent components in the fourth embodiment, and a description thereof will be given simply or will not be given.

The TTR alignment scope 4 in the first embodiment measures the marks AM1 and AM2, but that in the fourth embodiment directly measures aberration measurement patterns.

As described above, the prior arts detect the amount of light transmitted through, for example, both the slit 40 and the slit 44 or window 45 using the image sensing element 11 to align the aberration measurement patterns. The prior arts adopt a light amount detection scheme, so they can hardly detect light transmitted through the slit 40 as a micropattern because its irradiation range is narrow. In other words, the detection range is so narrow that it takes time to perform the measurement while searching for a region which falls outside the detection range. In contrast, this embodiment adopts not the light amount detection scheme but a detection scheme of sensing the aberration measurement patterns by a microscope (TTR alignment scope), and determining the positions of the aberration measurement patterns from the sensing result. For this reason, the amount of misalignment can be measured as long as the aberration measurement patterns fall within the field of the TTR alignment scope 4. The field of the TTR alignment scope 4 typically has a size of about 100 $\mu m^2$ (the size on the second mask), that is very large compared to the slit 40, so the detection range can be enlarged from that in the prior arts. The larger the field of the TTR alignment scope 4, the wider the detection range. However, an appropriate size of field is preferably selected in consideration of disadvantages of the field enlargement, such as increases in the size of the TTR alignment scope 4 and in the degree of design difficulty.

The use of the TTR alignment scope 4 makes it possible to simultaneously measure the aberration measurement patterns on the first mask and second mask, thus allowing alignment in a short period of time.

However, the present invention is not particularly limited to the simultaneous measurement. For example, by measuring the position of the aberration measurement pattern on the second mask by the TTR alignment scope, and subsequently measuring the position of the aberration measurement pattern on the first mask by it, the relative position between these patterns can be obtained and aligned. Although the aberration measurement pattern on the second mask is measured first herein, the same effect can be obtained even when the aberration measurement pattern on the first mask is measured first.

In this embodiment, the TTR alignment scope 4 directly measures the aberration measurement patterns. It is therefore unnecessary to pay attention to alignment errors that may occur in the first to third embodiments due to, for example, the fact that the relative position between the mark AM1 and the aberration measurement pattern on the first mask differs from a design value due to, for example, manufacturing errors or the deformation of the mask surface. The same applies to alignment errors due to, for example, the fact that the relative position between the mark AM2 and the aberration measurement pattern on the second mask differs from a design value due to, for example, manufacturing errors or the deformation of the mask surface. This allows alignment with high accuracy.

Fifth Embodiment

The fifth embodiment of the present invention will be described below with reference to FIG. 10. Note that the same reference numerals as in the above-described third embodiment denote the same or similar constituent components in the fifth embodiment, and a description thereof will be given simply or will not be given.

The reticle alignment scope 26 and reticle focus sensor 27 in the third embodiment measure the mark AM1, and the wafer alignment scope 16 and wafer focus sensor 17 in the third embodiment measure the mark AM2, but those in the fifth embodiment directly measure aberration measurement patterns.

As in the fourth embodiment, the fifth embodiment adopts not the light amount detection scheme but a shape detection scheme of observing the pattern shapes by microscopes (reticle alignment scope 26 and wafer alignment scope 16). For this reason, the amount of misalignment can be measured as long as the aberration measurement patterns fall within the fields of the reticle alignment scope 26 and wafer alignment scope 16, and alignment can be performed based on the measurement value.

Also in this embodiment, the detectors 26 and 27 which detect the position of the aberration measurement pattern on the first mask are different from the detectors 16 and 17 which detect the position of the aberration measurement pattern on the second mask, thus allowing alignment in a short period of time.

In this embodiment, the reticle alignment scope 26 and wafer alignment scope 16 directly measure the aberration measurement patterns. It is therefore unnecessary to pay attention to alignment errors due to, for example, the fact that the relative position between the mark AM1 and the aberration measurement pattern on the first mask differs from a design value due to, for example, manufacturing errors. The same applies to alignment errors due to, for example, the fact that the relative position between the mark AM2 and the aberration measurement pattern on the second mask differs from a design value due to, for example, manufacturing errors. This allows alignment with high accuracy.

The reticle focus sensor 27 and wafer focus sensor 17 directly measure the aberration measurement patterns as well. Therefore, the measurement results are free from the influence of differences in level between the aberration measurement patterns and points, which are measured by the focus sensors, attributed to, for example, the deformations or the degrees of flatness of the masks on which the aberration measurement patterns are formed. This allows measurement with a higher accuracy.

[Modification]

When the first to fifth embodiments are applied to an apparatus which scans a reticle stage, such as a scanner, the mark AM1 and the pattern on the first mask can align themselves in the scanning direction. In this case, the aberration measurement patterns on the first mask and second mask can be aligned in a short period of time only by moving the marks AM1 and AM2 after the relative position between the marks AM1 and AM2 is aligned. Then, the marks AM1 and AM2 can be positioned at the same image height with respect to the projection optical system. This makes it possible to make uniform the influences of, for example, the magnification and distortion of the projection optical system, which are exerted on the imaging position. This also makes it possible to uniform the influences of, for example, the curvature of field and the astigmatism of the projection optical system. This allows alignment with a higher accuracy.

Figure 11:
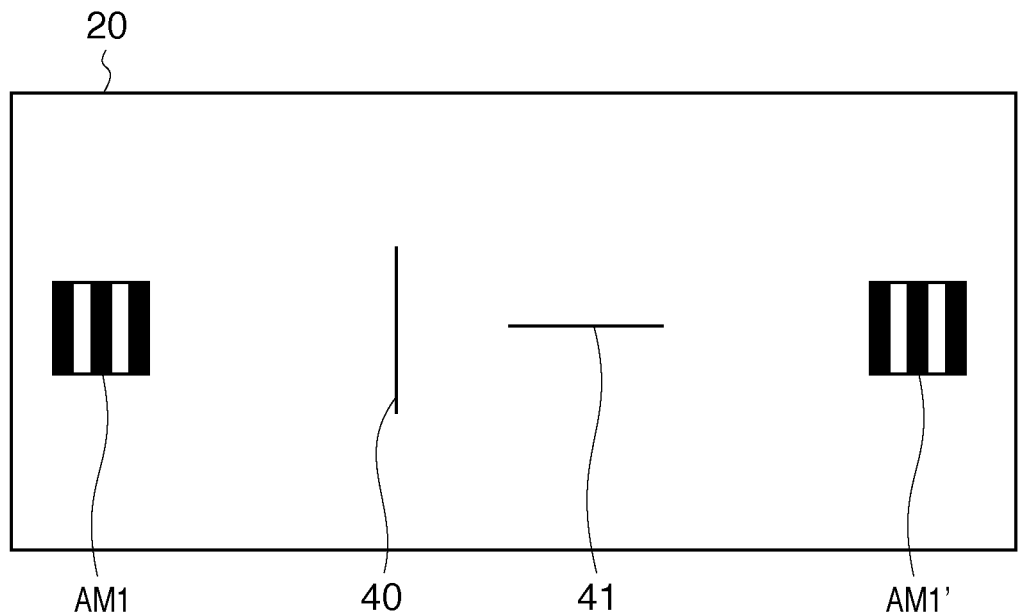
FIG. 11 is a schematic view showing the arrangement of a pattern.
Figure 12:
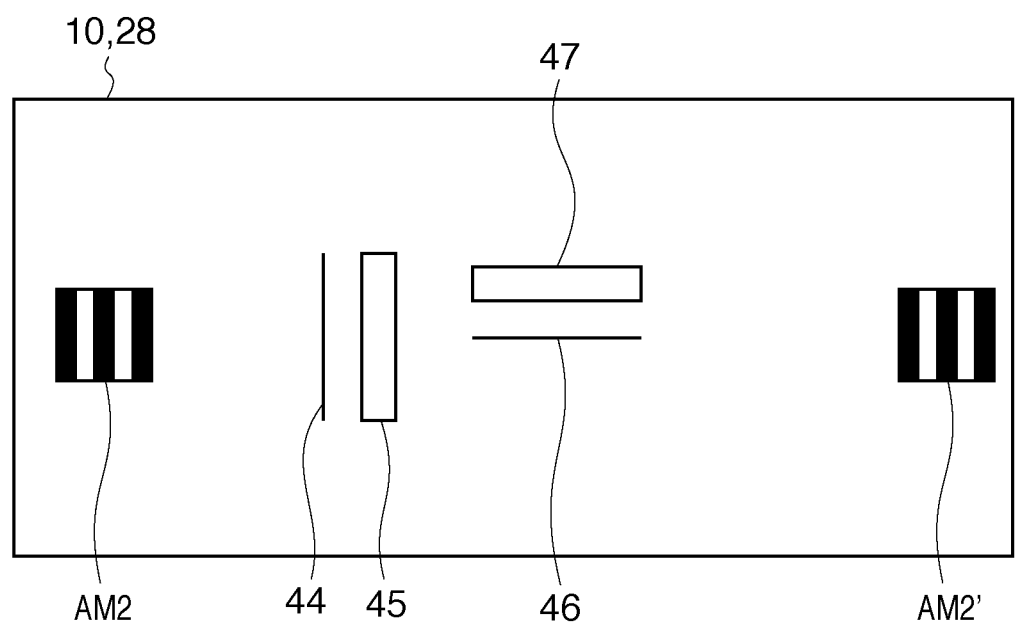
FIG. 12 is a schematic view showing the arrangement of a pattern.

Although one mark AM1 and one mark AM2 are formed in the first to fifth embodiments, the present invention is not particularly limited to this, and a plurality of marks AM1 and a plurality of marks AM2 may be formed. For example, alignment marks AM1 and AM1' are positioned to oppose each other through aberration measurement patterns on the first mask, as shown in FIG. 11. Likewise, alignment marks AM2 and AM2' are positioned to oppose each other through aberration measurement patterns on the second mask (FIG. 12). In this case, it is possible to measure rotational components on the mask plane and magnification components of the mask and projection optical system, unlike a case in which only one alignment mark is positioned on each mask. Driving the stages and correcting the projection optical system by taking account of these components makes it possible to align the aberration measurement patterns with a higher accuracy. In addition, measurement using two alignment marks on each mask averages measurement errors, thus allowing measurement with a higher accuracy.

At this time, the relative positional relationship between the alignment marks AM1 and AM1' and the aberration measurement pattern on the first mask, and that between the alignment marks AM2 and AM2' and the aberration measurement pattern on the second mask are desirably determined by taking account of the reduction ratio of the projection optical system. Alignment between the alignment marks amounts to that between the aberration measurement patterns. Hence, aberration measurement can become ready in a short period of time.

The number of alignment marks positioned is not particularly limited to two, and the same effect is expected to be obtained even when a larger number of alignment marks are positioned. For example, high accuracy is expected to be attained by the effect of measurement and correction or averaging of distortion components.

Although the first, second, and fourth embodiments have been described assuming that positions on the mask planes, that is, positions on planes perpendicular to the optical axis of the projection optical system are aligned, the present invention is not particularly limited to this, and alignment in the optical axis direction of the projection optical system may be performed. This makes it possible to align the aberration measurement pattern with the focal position of the projection optical system using the alignment mark as a reference, in a short period of time. The alignment in the optical axis direction can produce a beneficial effect even when measurement is performed at only one point, but it is expected to produce a more beneficial effect when measurement is performed at a plurality of points. For example, measurement at two points makes it possible to obtain the tilt of a straight line that connects these two points with respect to the optical axis direction of the projection optical system. Adding a third point onto the straight line that connects these two points makes it possible to obtain the curvature (the curvature of field) with respect to the optical axis direction of the projection optical system. Increasing the number of points makes it possible to obtain the curvature in more detail. Also, adding a third point to an arbitrary position other than the positions on the straight line that connects these two points makes it possible to obtain the tilt of the mask plane with respect to the optical axis direction of the projection optical system. Adding arbitrary measurement points also makes it possible to obtain the unevenness of the mask plane. Obtaining the focal positions of a light beam in the sagittal direction and meridional direction of the projection optical system makes it possible to measure the astigmatism.

Correcting the positions of the aberration measurement patterns by amounts corresponding to these measurement values in aligning them allows alignment with higher accuracy.

In the first to fifth embodiments, if the positional relationship between the alignment marks and the aberration measurement patterns differs from a design value due to, for example, manufacturing errors, the amount of deviation is desirably measured in advance and corrected in aligning the aberration measurement patterns. This makes it possible to align the aberration measurement patterns with high accuracy in a short period of time even when manufacturing errors have occurred.

An optimum position of the aberration measurement pattern can be determined by measuring the light amount obtained by the image sensing element 11. The difference between the measurement value obtained by using the alignment mark and an optimal position of the aberration measurement pattern need only be stored in advance as the amount of deviation.

Although an aberration measurement pattern and alignment mark are formed on the first mask in the first to fifth embodiments, the present invention is not particularly limited to this. A third mask different from the first mask may be set on the reticle stage, provided with an aberration measurement pattern or alignment mark, and used together with the first mask. For example, the alignment marks may be aligned using the third mask, and the imaging performance of the projection optical system may be measured using the aberration measurement pattern on the first mask. As is obvious, the same effect can be obtained even by swapping the roles of these masks.

Even in these cases, measuring the positional relationship between the alignment marks and the aberration measurement patterns in advance allows alignment with higher accuracy, as has been described above.

Although an aberration measurement pattern and alignment mark are formed on the second mask in the first to fifth embodiments, the present invention is not particularly limited to this. A fourth mask different from the second mask may be set on the wafer stage, provided with an aberration measurement pattern or alignment mark, and used together with the second mask. For example, the alignment marks may be aligned using the fourth mask, and the imaging performance of the projection optical system may be measured using the aberration measurement pattern on the second mask. As is obvious, the same effect can be obtained even by swapping the roles of these masks.

Even in these cases, measuring the positional relationship between the alignment marks and the aberration measurement patterns in advance allows alignment with higher accuracy, as has been described above.

Although the above description has been given assuming that two masks are provided on the reticle side or wafer side, the present invention is not particularly limited to this. The effect of the present invention can be obtained even by providing a plurality of masks on both the reticle side and wafer side and separately using them according to the circumstances involved. In this case, the number of masks formed on the reticle side need not always be equal to that of masks formed on the wafer side.

Although the third and fifth embodiments have been described assuming that the reticle alignment scope 26 and reticle focus sensor 27 are separate constituent components, the present invention is not particularly limited to this, and they may be the same constituent component. Likewise, although these embodiments have been described assuming that the wafer alignment scope 16 and wafer focus sensor 17 are separate constituent components, the present invention is not particularly limited to this, and they may be the same constituent component.

Although the first to fifth embodiments have exemplified a case in which slit patterns for aberration measurement are used as the patterns for measuring the aberration of the projection optical system, the present invention is not particularly limited to this. The same effect is expected to be obtained even by using patterns such as pinholes or diffraction gratings as long as the relative position can be aligned using them as precise aberration measurement patterns on the reticle side and wafer side. In particular, the use of such patterns is effective in a measurement method such as a shearing interferometer method, in which diffracted light components become out of phase due to a misalignment and this exerts a great influence on the measurement.

[Method of Manufacturing Device]

Devices (e.g., a semiconductor integrated circuit device and liquid crystal display device) are manufactured by an exposure step of exposing a substrate using the exposure apparatus according to each of the above-described embodiments, a development step of developing the substrate exposed in the exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-21648, filed Jan. 31, 2008, which is hereby incorporated by reference herein in its entirety.

What is claimed is:

1. An exposure apparatus which exposes a substrate to a pattern of an original, the apparatus comprising:
an original stage which supports the original;
a substrate stage which supports the substrate;
a projection optical system which projects the pattern of the original onto the substrate; and
a measurement system which measures an aberration of the projection optical system, the measurement system including
a first pattern for aberration measurement, which is formed on a first mask supported by the original stage,
a second pattern for aberration measurement, which is formed on a second mask supported by the substrate stage,
a third pattern formed on the first mask to align the first pattern and the second pattern, the third pattern positioned at a position spaced apart from the first pattern by a first predetermined distance,
a fourth pattern formed on the second mask to align the first pattern and the second pattern, the fourth pattern positioned at a position spaced apart from the second pattern by a second predetermined distance,
a detection system which illuminates the third pattern and the fourth pattern and simultaneously detects light from the third pattern and light from the fourth pattern for obtaining information about relative positions between the third pattern and the fourth pattern in an optical axis direction of the projection optical system and a direction perpendicular to the optical axis, and
a controller which controls at least one of the original stage and the substrate stage to align the third pattern and the fourth pattern in the optical axis direction and the direction perpendicular to the optical axis based on information about the relative positions between the third pattern and the fourth pattern detected by the detection system, and controls the original stage and the substrate stage to align the first pattern and the second pattern in the optical axis direction and the direction perpendicular to the optical axis based on information of the relative position between first pattern and the third pattern and the relative position between the second pattern and the fourth pattern after the third pattern and the fourth pattern are aligned,
wherein the measurement system measures the aberration of the projection optical system using the first pattern and the second pattern after the first pattern and the second pattern are aligned by controlling the original stage and the substrate stage.

2. The apparatus according to claim 1, wherein
the detection system includes a TTR alignment scope which simultaneously senses both the third pattern and the fourth pattern and determines the relative position between the third pattern and the fourth pattern from a sensing result by the TTR alignment scope, and
the controller controls at least one of the original stage and the substrate stage to align the first pattern and the second pattern, based on the relative position between the third pattern and the fourth pattern determined by the TTR alignment scope.

3. The apparatus according to claim 1, wherein
the detection system includes a detector which is positioned on the substrate stage and detects light transmitted through both the third pattern, the projection optical system and the fourth pattern, and
the controller controls at least one of the original stage and the substrate stage to align the first pattern and the second pattern, based on an output from the detector.

4. The apparatus according to claim 1, wherein
the detection system includes an original alignment scope which senses the third pattern and determines a position of the third pattern from a sensing result by the original alignment scope, and a substrate alignment scope which senses the fourth pattern and determines a position of the fourth pattern from a sensing result by the substrate alignment scope, and
the controller controls at least one of the original stage and the substrate stage to align the first pattern and the second pattern, based on the position of the third pattern determined by the original alignment scope and the position of the fourth pattern determined by the substrate alignment scope.

5. The apparatus according to claim 1, wherein a plurality of third patterns and a plurality of fourth patterns are formed, and
wherein the detection system measures at least one of rotation and magnification of the first mask on which the plurality of third patterns are formed and the second mask on which the plurality of fourth patterns are formed and magnification and distortion of the projection optical system by detecting the plurality of third patterns and the plurality of fourth patterns, and the first pattern and the second pattern are aligned by using a measurement result by the detection system.

6. The apparatus according to claim 1, wherein the relative position between the third pattern and the fourth pattern in the optical axis direction of the projection optical system are detected at a plurality of points to measure curvature of field of the projection optical system, and the first pattern and the second pattern are aligned in the optical axis direction by using the measured curvature of field.

7. The apparatus according to claim 1, wherein at least one of the relative position between first pattern and the third pattern and the relative position between the second pattern and the fourth pattern is measured.

8. The apparatus according to claim 1, wherein a controller which controls the original stage and the substrate stage to align the first pattern and the second pattern by moving the original stage by the first predetermined distance and moving the substrate stage by the second predetermined distance based on information of the relative position between first pattern and the third pattern and the relative position between the second pattern the fourth pattern after the third pattern and the fourth pattern are aligned.

9. A method of manufacturing a device, the method comprising:
exposing a substrate using an exposure apparatus;
developing the exposed substrate; and
processing the developed substrate to manufacture the device,
wherein the exposure apparatus includes an original stage which supports the original,
a substrate stage which supports the substrate,
a projection optical system which projects the pattern of the original onto the substrate, and
a measurement system which measures an aberration of the projection optical system, and
the measurement system includes
a first pattern for aberration measurement, which is formed on a first mask supported by the original stage,
a second pattern for aberration measurement, which is formed on a second mask supported by the substrate stage,
a third pattern formed on the first mask to align the first pattern and the second pattern, the third pattern positioned at a position spaced apart from the first pattern by a first predetermined distance,
a fourth pattern formed on the second mask to align the first pattern and the second pattern, the fourth pattern positioned at a position spaced apart from the second pattern by a second predetermined distance,
a detection system which illuminates the third pattern and the fourth pattern and simultaneously detects light from the third pattern and light from the fourth pattern for obtaining information about relative positions between the third pattern and the fourth pattern in an optical axis direction of the projection optical system and a direction perpendicular to the optical axis, and
a controller which controls at least one of the original stage and the substrate stage to align the third pattern and the fourth pattern in the optical axis direction and the direction perpendicular to the optical axis based on information about the relative positions between the third pattern and the fourth pattern detected by the detection system, and controls the original stage and the substrate stage to align the first pattern and the second pattern in the optical axis direction and the direction perpendicular to the optical axis based on information of the relative position between first pattern and the third pattern and the relative position between the second pattern and the fourth pattern after the third pattern and the fourth pattern are aligned,
wherein the measurement system measures the aberration of the projection optical system using the first pattern and the second pattern after the first pattern and the second pattern are aligned controlling the original stage and the substrate stage.

* * * * *